United States Patent [19]
Kim et al.

[11] Patent Number: 5,940,018
[45] Date of Patent: Aug. 17, 1999

[54] NB2P CODING/DECODING DEVICE

[75] Inventors: Jin-Young Kim; Bhum-Cheol Lee; Kwon-Chul Park, all of Daejeon, Rep. of Korea

[73] Assignees: Electonics and Telecommunications Research Institute, Daejeon; Korea Telecommunication Authority, Seoul, both of Rep. of Korea

[21] Appl. No.: 08/941,214

[22] Filed: Sep. 30, 1997

[30] Foreign Application Priority Data

Dec. 20, 1996 [KR] Rep. of Korea .................. 96-68948

[51] Int. Cl.⁶ .................................................. H03M 13/00
[52] U.S. Cl. ............................................ 341/94; 371/49.1
[58] Field of Search ................... 341/50, 94, 95; 371/49.1

[56] References Cited

U.S. PATENT DOCUMENTS

| | | | |
|---|---|---|---|
| 4,486,739 | 12/1984 | Franaszek et al. | 341/59 |
| 4,975,916 | 12/1990 | Miracle et al. | 371/47.1 |
| 5,025,256 | 6/1991 | Stevens | 341/59 |
| 5,396,239 | 3/1995 | McMahon et al. | 341/58 |
| 5,465,262 | 11/1995 | Dell et al. | 371/49.3 |

*Primary Examiner*—Marc S. Hoff
*Attorney, Agent, or Firm*—Antonelli, Terry, Stout & Kraus, LLP

[57] ABSTRACT

An nB2P coding/decoding device having a line code function facilitating data transmission and data recovery in the transmission line or link, and a function of a channel code for detecting errors in the recovered data, is provided, including: an nB2P coding device for dividing n bit width parallel data into two data units each having a predetermined bit width, and serial-transmitting the resulting n+2 bit coded data to which two odd parity bits are added, with predetermined n+2 bit with block synchronization data which is orthogonal to the coded data; and an nB2P decoding device for detecting the block synchronization data from the serially transmitted data, converts serial data to parallel form of n+2 bits, checking for errors in the coded data using the odd parity, and removing the odd parity to decode them into the original n bit width parallel data.

8 Claims, 2 Drawing Sheets

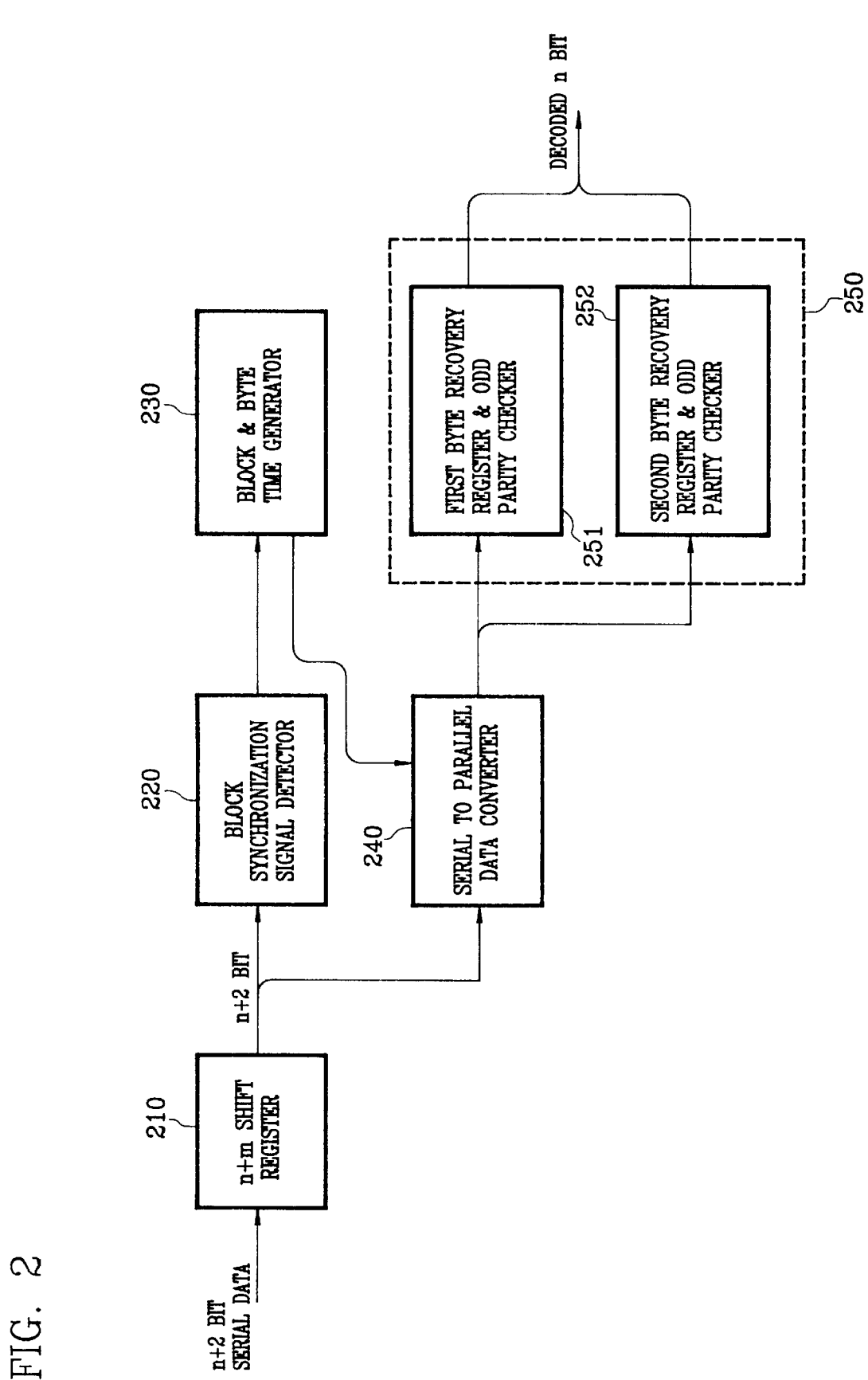

NB2P CODING/DECODING DEVICE

BACKGROUND OF THE INVENTION

1. Field of the Invention

The present invention relates to an nB2P coding/decoding device with a line code function for easily transmitting data and recoverring data from a transmission line, and a channel code function for detecting errors in the retrieved data.

2. Discussion of Related Art

In general, a line code and a channel code are used individually in data transmission or data link.

The line code used for high speed transmission requires many transitions, a good direct current balance, and a small increase in the transmission line bit speed compared to the source bit speed. For example, a scrambled NRZ (None Return to Zero), a code mark inversion (CMI), and 8B10B code (U.S. Pat. No. 4,486,739 by Peter A. Franaszek, Albert X. Widmer) are widely used line codes.

But, among those conventional line codes, the scrambled NRZ limits the number of the transition, and CMI requires a large increase in the transmission bit speed. In addition, the scrambled NRZ, CMI, and 8B10B should use an additional channel code for detecting line errors. Specifically, the 8B10B code is widely used for data links. Since the transmission bit speed of 8B10B is increased slightly by 10/8 and its DC balance is good, it is used in the computer network. But the 8B10B is a line code, and therefore it needs an additional channel code for detecting errors generated in the line. Also, when the serially transmitted bits are reconstituted into bytes, the 8B10B uses a complex algorithm or restricts the source data for the byte-synchronization, because the signal used for the byte synchronization is not orthogonal.

A method of making a code by adding a widely used parity bit to a data bit is the most suitable for a cyclic code among block codes. The method adds the parity to the data so that the block becomes an even or odd number. This invention is based on a parity code method which is a kind of the block codes described above. The method can detect data errors, because the method pertains to channel codes, but the method cannot ensure the number of transitions in the data bit and the complex method requires byte synchronization detection for the serially transmitted data.

SUMMARY OF THE INVENTION

Accordingly, the present invention is directed to an nB2P coding/decoding device that substantially obviates one or more of the problems due to limitations and disadvantages of the related art.

An objective of the present invention is to provide an nB2P coding/decoding device which increases transmission bit speed by a small amount, and which easily realizes byte synchronization by making an orthogonal signal for the byte synchronization without using an additional channel code in order to detect a bit error generated from a coder or decoder.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an nB2P coding/decoding device having a line code function facilitating data transmission and data recovery in the transmission line or link, and a function of a channel code for detecting errors in the recovered data includes:

- an nB2P coding device for dividing n bit width parallel data into two data units each having a predetermined bit width, and serially-transmitting the resulting n+2 bit coded data to which two odd parity bits are added, with predetermined n+2 bits of block synchronization data which is orthogonal to the coded data; and
- an nB2P decoding device for detecting the block synchronization data from the serially transmitted data, checking for errors in the coded data using the odd parity, and removing the odd parity to decode them into the original n bit width parallel data.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2 is a block diagram of a decoding device of the invention.

DETAILED DESCRIPTION OF PREFERRED EMBODIMENT

Figure 1:
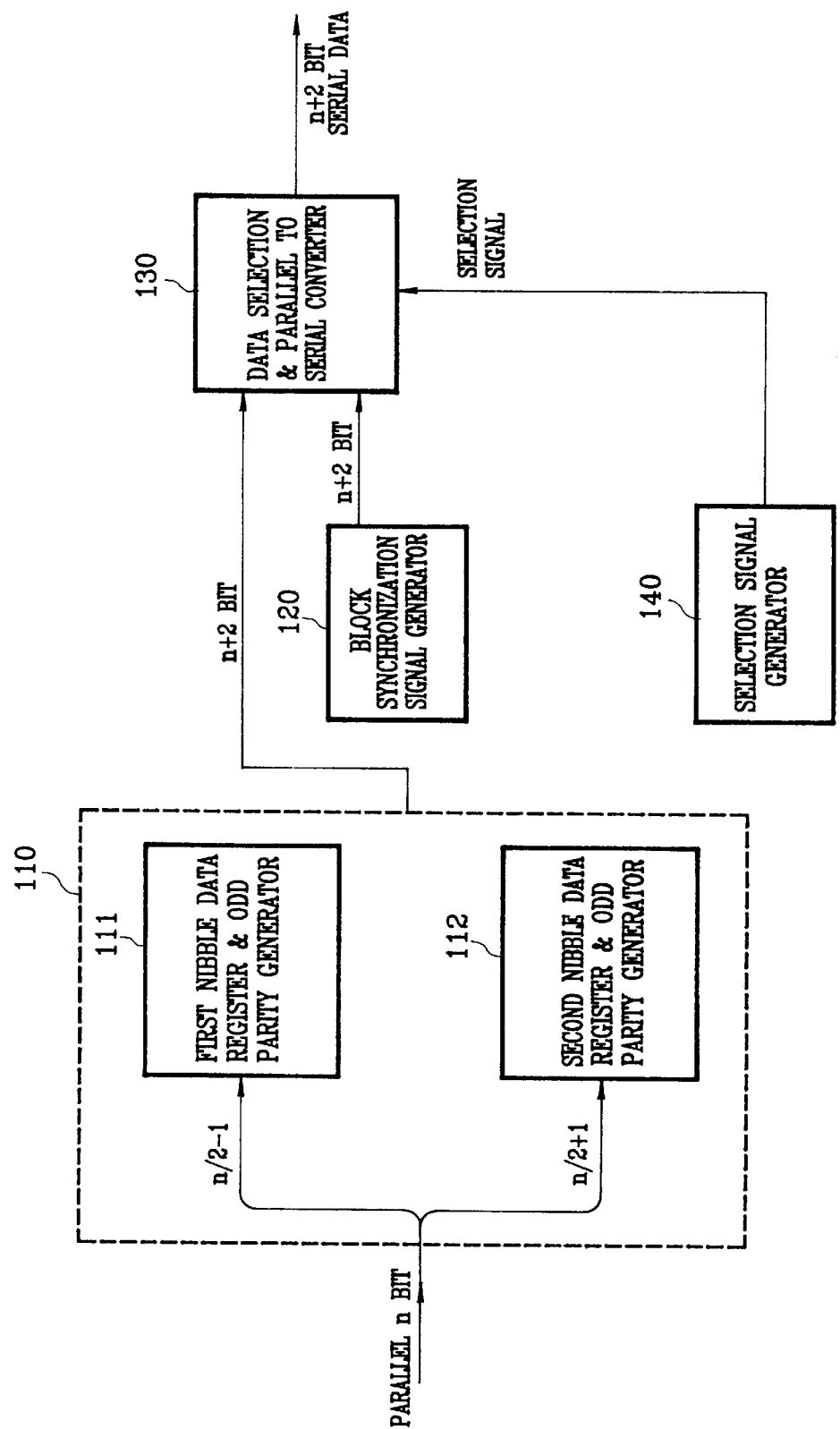
FIG. 1 is a block diagram of a coding device of the invention.

Reference will now be made in detail to the preferred embodiments of the present invention, examples of which are illustrated in the accompanying drawings.

An nB2P coding method of the invention is described as follows. A byte of n bit parallel data is divided into two nibbles, so that each nibble has odd bits. For example, if n is an even number, the byte is divided into (n/2)+1 and (n/2)−1. One bit of odd parity is added to each nibble, so that the byte is made with two nibbles each, having the one-added parity bit, thereby forming the odd bit nibble and odd parity. To synchronize a block or frame, a code violation is performed with respect to the coded data, so that an orthogonal block synchronization signal is generated. Here, the code violation is a step for preventing the encoded data from having the odd parity, and the meaning of "orthogonal" is independent from the coded data.

An nB2P decoding method of the invention is as follows. First, decoder of the invention detects the byte synchronization by means of detecting the block synchronization signal from a bit stream, that is the serial data, changes the serial data into parallel data, divides the parallel data into two nibbles in the same manner as the above coding method, confirms each odd parity added to the nibbles and removes the parity from each nibble, in order to recover the original byte. As the serial data is a byte formed of (n+2) bits, when dividing the data into two nibbles, the higher nibble is (n+2)/2+1 and the lower nibble is ((n+2)/2)+1.

The above-mentioned coding method of the invention will be specifically described with an example of data bytes with a bit number of eight.

As the bit number of the one byte of the source data is eight, the data may be divided into a 3-bit nibble and the other 5-bit nibble. When the bits of one byte of the source data are B7, B6, B5, B4, B3, B2, B1, B0, starting with the most significant bit, the 3-bit nibble has the bits of B7, B6 and B5, and the other 5-bit nibble has the remaining bits B4, B3, B2, B1, B0. In this case the nibble composed of B7, B6, B5 is the higher nibble and the nibble composed of B4, B3, B2, B1, B0 is the lower nibble. As a result, each higher/lower nibble contains an odd number of bits.

In the coding method of the invention, an odd parity is added to the higher nibble so that the newly made higher nibble has B7, B6, B5, P1. In a same manner, the lower nibble has B4, B3, B2, B1, B0, P0. Therefore, the coded 10-bit byte is formed of B7, B6, B5, P1, B4, B3, B2, B1, B0, P0. The coded byte is denoted as 8B2P, and has the following characteristics. First, even if all of the transmission source data bytes are either "0" or "1", three transitions exist in one byte(ex.: 0001000001, 1110111110). Second, the code error is the channel code error, and therefore the error generated in the line and the coding/decoding device are detectable. Third, an orthogonal pattern in the bit pattern can be used as the block synchronization signal by performing the code violation from one of the two nibbles (for example, 1000000000, 0111111111 or 0000000001, 1111111110). The violated code as a preset code is not treated as the error, and errors generated in the line and the coding/decoding device can be detected by examining with the cyclic synchronization pattern. Fourth, the maximum run length of "0" or "1" is fourteen, namely, (n+1)+{(n/2)+1};n is even number, and is generated the block synchronization signal causing the code violation.

The following table 1 illustrates the above-described coded data. In the table 1, the coding method of the invention with respect to one byte of 8 bits of source data is specifically described.

TABLE 1

| magnitude | Source Data | | | | | | | | Encoded Data | | | | | | | | | |
|---|---|---|---|---|---|---|---|---|---|---|---|---|---|---|---|---|---|---|
| | b7 | b6 | b5 | b4 | b3 | b2 | b1 | b0 | b7 | b6 | b5 | p1 | b4 | b3 | b3 | b2 | b0 | p0 |
| 0 | 0 | 0 | 0 | 0 | 0 | 0 | 0 | 0 | 0 | 0 | 0 | 1 | 0 | 0 | 0 | 0 | 0 | 1 |
| 1 | 0 | 0 | 0 | 0 | 0 | 0 | 0 | 1 | 0 | 0 | 0 | 1 | 0 | 0 | 0 | 0 | 1 | 0 |
| 2 | 0 | 0 | 0 | 0 | 0 | 0 | 1 | 0 | 0 | 0 | 0 | 1 | 0 | 0 | 0 | 1 | 0 | 0 |
| 3 | 0 | 0 | 0 | 0 | 0 | 0 | 1 | 1 | 0 | 0 | 0 | 1 | 0 | 0 | 0 | 1 | 1 | 1 |
| 4 | 0 | 0 | 0 | 0 | 0 | 1 | 0 | 0 | 0 | 0 | 0 | 1 | 0 | 0 | 1 | 0 | 0 | 0 |
| 5 | 0 | 0 | 0 | 0 | 0 | 1 | 0 | 1 | 0 | 0 | 0 | 1 | 0 | 0 | 1 | 0 | 1 | 1 |
| 6 | 0 | 0 | 0 | 0 | 0 | 1 | 1 | 0 | 0 | 0 | 0 | 1 | 0 | 0 | 1 | 1 | 0 | 1 |
| 7 | 0 | 0 | 0 | 0 | 0 | 1 | 1 | 1 | 0 | 0 | 0 | 1 | 0 | 0 | 1 | 1 | 1 | 0 |
| — | | | | | | | | | | | | | | | | | | |
| 124 | 0 | 1 | 1 | 1 | 1 | 1 | 0 | 0 | 0 | 1 | 1 | 1 | 1 | 1 | 1 | 0 | 0 | 0 |
| 125 | 0 | 1 | 1 | 1 | 1 | 1 | 0 | 1 | 0 | 1 | 1 | 1 | 1 | 1 | 1 | 0 | 1 | 1 |
| 126 | 0 | 1 | 1 | 1 | 1 | 1 | 1 | 0 | 0 | 1 | 1 | 1 | 1 | 1 | 1 | 1 | 0 | 1 |
| 127 | 0 | 1 | 1 | 1 | 1 | 1 | 1 | 1 | 0 | 1 | 1 | 1 | 1 | 1 | 1 | 1 | 1 | 0 |
| 128 | 1 | 0 | 0 | 0 | 0 | 0 | 0 | 0 | 1 | 0 | 0 | 0 | 0 | 0 | 0 | 0 | 0 | 1 |
| 129 | 1 | 0 | 0 | 0 | 0 | 0 | 0 | 1 | 1 | 0 | 0 | 0 | 0 | 0 | 0 | 0 | 1 | 0 |
| 130 | 1 | 0 | 0 | 0 | 0 | 0 | 1 | 0 | 1 | 0 | 0 | 0 | 0 | 0 | 0 | 1 | 0 | 0 |
| 131 | 1 | 0 | 0 | 0 | 0 | 0 | 1 | 1 | 1 | 0 | 0 | 0 | 0 | 0 | 0 | 1 | 1 | 1 |
| 132 | 1 | 0 | 0 | 0 | 0 | 1 | 0 | 0 | 1 | 0 | 0 | 0 | 0 | 0 | 1 | 0 | 0 | 0 |
| 133 | 1 | 0 | 0 | 0 | 0 | 1 | 0 | 1 | 1 | 0 | 0 | 0 | 0 | 0 | 1 | 0 | 1 | 1 |
| 134 | 1 | 0 | 0 | 0 | 0 | 1 | 1 | 0 | 1 | 0 | 0 | 0 | 0 | 0 | 1 | 1 | 0 | 1 |
| 135 | 1 | 0 | 0 | 0 | 0 | 1 | 1 | 1 | 1 | 0 | 0 | 0 | 0 | 0 | 1 | 1 | 1 | 0 |
| — | | | | | | | | | | | | | | | | | | |
| 249 | 1 | 1 | 1 | 1 | 1 | 0 | 0 | 1 | 1 | 1 | 1 | 0 | 1 | 1 | 0 | 0 | 1 | 0 |
| 250 | 1 | 1 | 1 | 1 | 1 | 0 | 1 | 0 | 1 | 1 | 1 | 0 | 1 | 1 | 0 | 1 | 0 | 0 |
| 251 | 1 | 1 | 1 | 1 | 1 | 0 | 1 | 1 | 1 | 1 | 1 | 0 | 1 | 1 | 0 | 1 | 1 | 1 |
| 252 | 1 | 1 | 1 | 1 | 1 | 1 | 0 | 0 | 1 | 1 | 1 | 0 | 1 | 1 | 1 | 0 | 0 | 0 |
| 253 | 1 | 1 | 1 | 1 | 1 | 1 | 0 | 1 | 1 | 1 | 1 | 0 | 1 | 1 | 1 | 0 | 1 | 1 |
| 254 | 1 | 1 | 1 | 1 | 1 | 1 | 1 | 0 | 1 | 1 | 1 | 0 | 1 | 1 | 1 | 1 | 0 | 1 |
| 255 | 1 | 1 | 1 | 1 | 1 | 1 | 1 | 1 | 1 | 1 | 1 | 0 | 1 | 1 | 1 | 1 | 1 | 0 |
| s1 byte | Not Available | | | | | | | | 1 | 0 | 0 | 0 | 0 | 0 | 0 | 0 | 0 | 0 |
| s2 byte | Not Available | | | | | | | | 0 | 1 | 1 | 1 | 1 | 1 | 1 | 1 | 1 | 1 |
| s3 byte | Not Available | | | | | | | | 0 | 0 | 0 | 0 | 0 | 0 | 0 | 0 | 0 | 1 |
| s4 byte | Not Available | | | | | | | | 1 | 1 | 1 | 1 | 1 | 1 | 1 | 1 | 1 | 0 |

In the above table 1, the first column illustrates the values of the source data with a decimal digit. The second column illustrates the source data with a binary digit. The third column illustrates B7, B6, B5, P1 of the source data. The fourth column illustrates B4, B3, B2, B1, B0, P0 of the source data.

In the above table, Sr byte (r=1 to 4) is the block synchronization signal made by performing a code violation to detect block synchronization where one byte of the source is made of 8 bits. To maintain orthogonality of the block synchronization signal Sr, the S1 and S2 cannot be used simultaneously with S3 and S4.

A preferred embodiment of the invention is described specifically with reference to the attached drawings.

As illustrated in FIG. 1, the coding device has an odd bit nibble and odd parity generator 110 with first and second nibble data resister & odd parity generators 111, and 112, a block synchronization signal generator 120, a data selection/parallel to serial data converter 130, and a selection signal generator 140.

The odd bit nibble and odd parity generator 110 divides the parallel data, whose one byte is made of n bits, into two nibbles each with an odd number of bits, and adds 1-bit odd parity to each nibble to thereby generate one byte made of n+2 bits. Accordingly, the first and second nibble data register & odd parity generators 111 and 112 are described below.

The first nibble data register & odd parity generator 111 receives n-bit parallel data, temporarily stores the higher nibble made of odd bits in a register, and adds the odd parity of one bit to the higher nibble. Here, the higher nibble gets the odd bit of [n/2−1].

The second nibble data register & odd parity generator 112 receives an n-bit parallel data, temporarily stores the lower nibble made of odd bits in a register, and adds the odd parity of one bit to the lower nibble. Here, the lower nibble gets the odd bit of (n/2+1). Accordingly, the first and second nibble data register & odd parity generators 111 and 112, add respectively, one bit of odd parity to the 3-bit higher nibble and the 5-bit lower nibble. As a result, the odd bit nibble and odd parity generator 110 generates a new one byte made of ten bits (=n+2).

Block synchronization signal generator 120 continuously generates the code violating parallel data made of n+2 bits whose bit pattern is orthogonal to the coded data for the purpose of block synchronization of a block(or frame) and byte timing extraction in the following decoding device. In this example, the block synchronization signal generator 120 generates the block synchronization signal which is made of orthogonal code-violating n+2 bits code-violated against output data, that is, the coded input data, when n bit parallel data is entered variously according to a design use. The predetermined block synchronization signal, as mentioned above, is generated by performing a code-violation with respect to one of the two nibbles. Thus a block synchronization signal using a code-violation with respect to the higher nibble cannot be used simultaneously with a block synchronization signal using a code violation of the lower nibble.

The data selection & parallel to serial converter 130 selects the parallel data (=n+2) output from the odd bit nibble and odd parity generator 110 or the block synchronization signal generator 120 by control of the selection signal from selection signal generator 140, and converts the parallel data into the serial data to thereby transmit them to nB2P decoding device.

The selection signal generator 140 generates a selection signal according to expected timing slot and provides the selection signal to the data selection & parallel to serial data converter 130. Then, the data selection & parallel to serial data converter 130 selects the data (=n+2) output from the odd bit nibble and odd parity generator 110 or the block synchronization pattern, namely, the block synchronization data pattern generated by the block synchronization signal generator 120, according to the selection signal. When assuming that one block (or frame) of source data is composed of 64 bytes, the selection signal is generated every at 64th or more clock cycles. And the length of the signal is more than one clock cycle. That is, the selection signal generator 140 continuously outputs the logical low signal (or high signal) until the data output by the odd bit nibble and odd parity generator 110 reaches the $63^{rd}$ byte. When at the 65th bytes, the selection signal generator 140 generates a high state signal (or low signal) to select for the data selection & parallel to serial converter 130 the block synchronization pattern from the block synchronization signal generator 120. Of course, the period of high (or low) selection signal provided from the selection signal generator 140 is adjustable by the user. In the coded source data, a dummy byte is added to the timing slot into which the block synchronization signal is inserted, thus prevention loss of a source byte.

On the basis of the above-mentioned structure, an operation of the nB2P coding device is described with reference to the case of n=8 bit.

When 8-bit parallel data is input, the odd bit nibble and odd parity generator part 110 makes the higher and lower nibbles by dividing the eight bit byte into two odd bit nibbles, namely, three bits and five bits, and adds a bit for odd parity to each nibble, so that the coded data with bytes made of 10 bits are output. Thus, by adding an odd parity to each nibble, the decoding device easily detects errors generated in the lines without using an additional channel code. The data selection & parallel to serial data converter 130, having received the thus-output one byte, selects one byte according to the selection signal output from the selection signal generator 140, and converts the selection signal into serial data for transmission. This step is repeated until first through sixty-fourth bytes are output when each block is made of 64 bytes. During its repetition, before the 6rth byte, the dummy byte is input, the selection signal generator 140 outputs the selection signal for selecting the block synchronization pattern of preset 10 bits. Accordingly, the data selection & parallel to serial data converter 130 selects the block synchronization pattern and converts it into serial data. The thus-output block synchronization pattern enables the nB2P decoding device to extract the synchronization of the block and byte without using a complex algorithm. That is, the decoding device easily synchronizes the block and byte.

With reference to FIG. 2, a structure of the decoding device of the invention will be described below.

The decoding device includes a (n+m) shift register 210, a block synchronization signal detector (220), a block and byte time extractor 230, a serial to parallel data converter 223, and a byte recovery and odd parity examining part 250 consisting of the first and second byte recovery register & odd parity checkers 251 and 252.

The (n+m) shift register 210 shifts n+2 bit serial data, namely a data bit stream made n+2 bits that is transmitted from the nB2P coding device, at a bit interval. Here, 'm' is a spare bit.

The block synchronization signal detector 220 checks the block synchronization pattern generated by the block synchronization signal generator 120, from the data bit stream output from the shift register 210 at every clock cycle. That is, the block synchronization signal detector 220 easily detects the block synchronization pattern output from the coding device by the same predetermined data pattern for detecting the block synchronization signal equal to the block synchronization pattern. That is to say, the present invention can simply match byte synchronization without utilizing a complex algorithm.

The block & byte timing extractor 230 receives the block synchronization pattern detected from the block synchronization signal detector 220, and extracts the block and byte timing. Thus, the block timing is the period from the time the previous block synchronization pattern in the received data was detected to the time the next block synchronization pattern is detected. The byte timing is the time of ten clock cycles because the length of the coded data is 10 bit.

The serial to parallel converter 240 converts the bit stream from the shift register 210 into parallel data using the extracted byte timing.

The byte recovery & odd parity checking part 250 checks if the data which is coded into n+2 bits by the nB2P coding device is coded according to the coding rule of the coding device, and decodes the data into the original n bits. The error of the coded data is detected in the byte recovery and odd parity checking part 250. In this regard, a specific description follows. The first byte recovery register & odd parity checker 251 temporarily stores the higher nibble of the n+2 bit parallel data, converted in the serial to parallel data converter 240, checks if there is an error in the higher nibble by checking the odd parity, and then removes the odd parity. Thus, the higher nibble is ((n+2)/2+1) bit. The second byte recovery register & odd parity checker 252 operates simultaneously with the first byte recovery register & odd parity checker 252 to thereby remove the odd parity. Thus, the lower nibble is (((n+2)/2)+1) bit. As a result, the data transmitted from the nB2P coding device is recovered into the original n bit data.

An operation of the thus-structured nB2P decoding device as well as the above-mentioned description, will be described below with an example of n=8.

If 10 bits of serial data are input from the nB2P coding device, the shift register 210 shifts at a bit interval. As the block synchronization pattern is in the forepart of the 10-bit serial data, the block synchronization signal detector 220 first detects the block synchronization pattern. The block & byte timing extractor 230, receiving the detected block synchronization pattern, extracts the byte timing and supplies it to the serial to parallel data converter 240.

Assuming that 64 bytes make a block, the serial to parallel data converter 240 converts the first through last bytes of the block into 10-bit parallel data using the byte timing. The block synchronization signal detector 220 checks if the block synchronization signal inserted into the end of a block is cyclic by using a determined code violated pattern. The purpose of the cyclic examination is to check if the block synchronization signal, which is generally input at every 64th cycle, is at its place. Of course, if there is an error in the preceding block synchronization signal, it is also detected.

The first and second byte recovery register & odd parity checker 251 and 252 receiving the parallel data converted by the serial to parallel data converter 240 divides the data into the higher and lower nibbles and checks the odd parity in each nibble to thereby detect the error of the coded data generated in the transmission line or link, coding device and decoding device. After examining the odd parity, the checkers 251 and 252 remove the odd parity to thereby decode the data into the original n bit parallel data.

The invention has the following effects.

First, the invention can easily detect errors in the transmission line by adding parity in the data, without using an additional channel code for detecting the errors in the line.

Second, the decoding device of the present invention can easily match byte synchronization without a complex algorithm for extracting the synchronization of the byte in the decoding device receiving the serial bit stream, because the coding device of the present invention simply generates an orthogonal pattern.

Third, as the invention has at least three transitions on one byte (namely, 00010000001, 1110111110) even when the source bytes are all 0 or 1, the clock extraction from the received data is easy.

Fourth, the invention simply performs the byte synchronization by generating an orthogonal signal, while the conventional parity coding method needs an additional complex method and device to determine byte synchronization in the serially transmitted data.

It will be apparent to those skilled in the art that various modifications and variations can be made in the nB2P coding and decoding device of the present invention without departing from the spirit or scope of the invention. Thus, it is intended that the present invention cover the modifications and variations of this invention provided they come within the scope of the appended claims and their equivalents.

What is claimed is:

1. An nB2P coding/decoding device having a line code function facilitating data transmission and data recovery in a transmission line or link, and a function of a channel code for detecting errors in the recovered data, comprising:

an nB2P coding device for dividing n bit width parallel data into two data units each having a predetermined bit width, and serial-transmitting the resulting n+2 bit coded data to which two odd parity bits are added, with predetermined n+2 bit with block synchronization data which is orthogonal to the coded data; and an nB2P decoding device for detecting the block synchronization data from the serially transmitted data, checking the errors in the coded data using the odd parity, and removing the odd parity to decode the code data into the original n bit width parallel data.

2. The device as claimed in claim 1, wherein the nB2P coding device comprises:

an odd bit nibble & odd parity generator for dividing n parallel data into two nibbles so that each nibble has odd bit widths, adding one bit of odd parity to each nibble, and thereby generating the coded data;

a block synchronization signal generator for performing a code-violation with respect to the coded data to thereby generate fixed block synchronization data;

a data selection & parallel to serial data converter for selecting either coded data, generated in said odd bit nibble & odd parity generator, or block synchronization data generated in the block synchronization signal generator, according to the selection signal, and converting the selected parallel data into serial data; and a selection signal generator for supplying a selection signal which is used to transmit the coded data and used to transmit the block synchronization data whenever the coded data are transmitted, to the parallel to serial data converter in accordance with a predetermined clock cycle.

3. The device as claimed in claim 2, wherein said odd bit nibble & odd parity generator comprises:

a first nibble data register & odd parity generator for generating an n/2−1 bit width higher nibble by dividing n bit width parallel data, and adding a bit of odd parity to the higher nibble; and a second nibble data register & odd parity generator for generating n/2+1 bit width lower nibble by dividing n width parallel data, and adding a bit of odd parity to the lower nibble.

4. The device as claimed in claim 2, wherein said block synchronization signal generator performs a code violation with respect to one of the two nibbles to thereby generate the block synchronization signal.

5. The device as claimed in claim 1, wherein the nB2P decoding device comprises:

a shift register for shifting n+2 bit width serial data transmitted from the nB2P coding device at a bit interval;

a block synchronization signal detector for detecting the block synchronization signal from the serial data out of shift register using a predetermined code violated data pattern;

a block & byte timing extractor for receiving the detected block synchronization signal to thereby extract the block & byte synchronization timing;

a serial to parallel data converter for converting coded data input from the shift register into parallel data, using an extracted byte timing; and a byte recovery & parity checking part for dividing the converted parallel data into the predetermined data units, checking each odd parity to detect if there is an error in the coded data, removing the odd parity to decode the data into the original n bit width byte.

6. The device as claimed in claim 5, wherein said shift register temporarily stores more than n+2 bits.

7. The device as claimed in claim 5, wherein the block synchronization signal detector checks errors of the block synchronization data generated in the transmission line, according to the predetermined code violated data pattern.

8. The device as claimed in claim 5, wherein said byte recovery & parity checking part comprises:

a first byte recovery register & odd parity checker for recovering n+2 bit width parallel data into the higher nibble of (n+2)/2−1, storing it, checking the odd parity added to the higher nibble, and then removing the parity; and a second byte recovery register & odd parity checker for recovering n+2 bit width parallel data into the lower nibble of (n+2)/2+1, storing it, checking the odd parity added to the lower nibble, and then removing it.

* * * * *